United States Patent
Lin

(10) Patent No.: US 10,811,298 B2
(45) Date of Patent: Oct. 20, 2020

(54) PATTERNED CARRIER WAFERS AND METHODS OF MAKING AND USING THE SAME

(71) Applicant: Micron Technology, Inc., Boise, ID (US)

(72) Inventor: Jing Cheng Lin, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/237,220

(22) Filed: Dec. 31, 2018

(65) Prior Publication Data

US 2020/0211888 A1   Jul. 2, 2020

(51) Int. Cl.
*H01L 21/683* (2006.01)
*H01L 23/544* (2006.01)
*H01L 21/033* (2006.01)
*H01L 21/66* (2006.01)

(52) U.S. Cl.
CPC ...... *H01L 21/6836* (2013.01); *H01L 21/0337* (2013.01); *H01L 22/30* (2013.01); *H01L 23/544* (2013.01); *H01L 2223/54426* (2013.01)

(58) Field of Classification Search
CPC ............ H01L 21/6836; H01L 21/0337; H01L 23/544; H01L 22/30
USPC ............... 257/797, 660, 678, 698, 737, 787, 257/E21.237, E21.499, E21.502, E21.504, 257/E21.508, E21.599, E23.01, E23.011, 257/E23.103, E23.114, E23.178, E29.022, 257/E31.127; 438/106, 107, 113, 114, 438/124, 455, 462

See application file for complete search history.

(56) References Cited

U.S. PATENT DOCUMENTS

| | | | |
|---|---|---|---|
| 8,431,441 B2* | 4/2013 | Chino | H01L 21/561 257/E21.504 |
| 9,659,806 B2* | 5/2017 | Chang | H01L 21/6835 |
| 10,049,955 B2* | 8/2018 | Chang | H01L 23/3135 |
| 2006/0001145 A1* | 1/2006 | Ho | H01L 23/13 257/690 |
| 2011/0316152 A1* | 12/2011 | Miki | H01L 21/561 257/737 |
| 2012/0061825 A1* | 3/2012 | Chang | H01L 21/561 257/737 |
| 2012/0086117 A1* | 4/2012 | Chang | H01L 23/49816 257/706 |
| 2017/0084545 A1* | 3/2017 | Seddon | H01L 21/304 |
| 2018/0323153 A1* | 11/2018 | Grivna | H01L 21/6836 |

* cited by examiner

*Primary Examiner* — Dao H Nguyen
(74) *Attorney, Agent, or Firm* — Perkins Coie LLP

(57) ABSTRACT

An apparatus is provided, comprising: a wafer having a first planar surface and a second surface opposite the first surface. The second surface includes a plurality of recesses. Each recess includes a plurality of sidewalls and a lower surface and is configured to receive a semiconductor device. The plurality of sidewalls of each recess is configured to align the semiconductor device and constrain the semiconductor device from moving in a direction parallel to the second surface.

18 Claims, 5 Drawing Sheets

US 10,811,298 B2

PATTERNED CARRIER WAFERS AND METHODS OF MAKING AND USING THE SAME

TECHNICAL FIELD

The present disclosure generally relates to semiconductor devices, and more particularly relates to patterned carrier wafers and method of using the same in semiconductor device manufacturing and testing.

BACKGROUND

Following their manufacture, semiconductor devices may be tested for functionality in a probe operation in which temporary electrical connections between a semiconductor device and a test apparatus are made. Performing these probe operations on a large number of semiconductor devices in an automated process can present a number of challenges. One such challenge involves the automated placement of semiconductor devices into an arrangement suitable for use by a testing apparatus, and another involves preventing the loss of alignment (i.e., preventing the movement) of the semiconductor devices during a probe operation that could prevent the automated pickup of the semiconductor devices for further processing after the probe operation is complete.

DETAILED DESCRIPTION

Figure 1A:
FIGS. 1A-1E are simplified diagrams of a process flow for fabricating a patterned carrier wafer and testing semiconductor devices therewith in accordance with one embodiment of the present technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

As discussed above, the placement of semiconductor devices before a probe operation (e.g., into an arrangement on a carrier apparatus) and the subsequent pickup of the semiconductor devices after the probe operation can present an engineering challenge, which is further compounded by the need to perform these functions on a large number of devices in an automated fashion. FIG. 1 shows one conventional approach to these challenges, involving the placement of semiconductor devices on a film frame into an arrangement expected by a test apparatus. Utilizing a film frame to secure semiconductor devices that are probed by a test apparatus (e.g., which are subjected to the pressures of a test probe making robust physical and electrical contact with the probe pads thereof) can, due to the lack of rigid support provided by the film, prevent the automated pickup of those of the semiconductor devices that have moved during the probe operation.

To address this and other challenges, embodiments of the present technology provide a patterned carrier wafer having a first planar surface and a second surface opposite the first surface. The second surface includes a plurality of recesses. Each recess includes a plurality of sidewalls and a lower surface and is configured to receive a semiconductor device. The plurality of sidewalls of each recess is configured to align the semiconductor device and constrain the semiconductor device from moving in a direction parallel to the second surface.

Figure 1B:
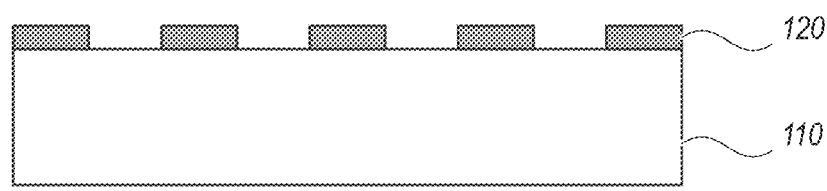
Figure 1C:
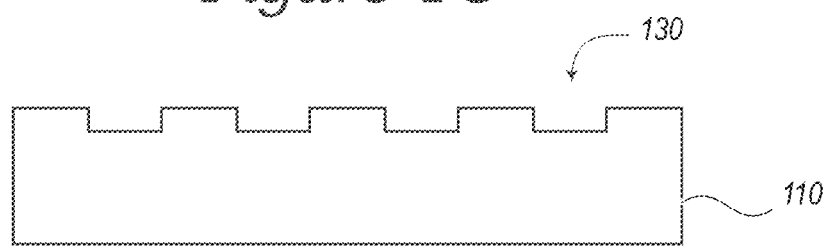

FIGS. 1A-1E is a simplified diagram of a process flow for fabricating a patterned carrier wafer and testing semiconductor devices therewith in accordance with one embodiment of the present technology. As can be seen with reference to FIG. 1A, the process flow begins with a wafer 110, such as a silicon wafer or a glass wafer, of a thickness suitable for supporting semiconductor devices during a probe operation (e.g., having a thickness between 500 µm and 1300 µm). As shown in FIG. 1B, a layer of patterned photoresist 120 or other mask material can be formed over wafer 110, using conventional photolithography techniques. The patterned photoresist 120 includes a plurality of openings corresponding to the recesses 130 shown to have been formed in FIG. 1C, by a suitable etching or other material removal process. The recesses have a size and shape corresponding to the semiconductor devices that the patterned carrier wafer 110 will be used to test.

Figure 1D:
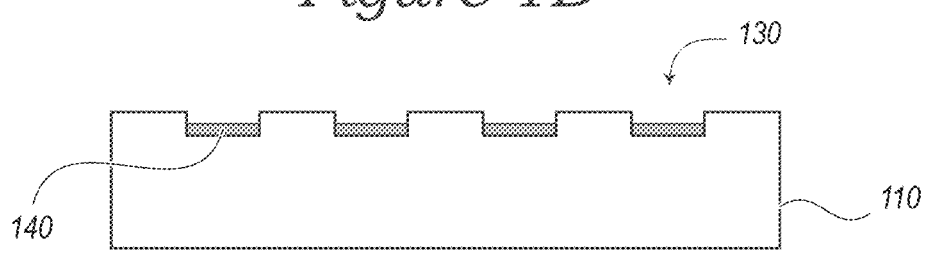
Figure 1E:
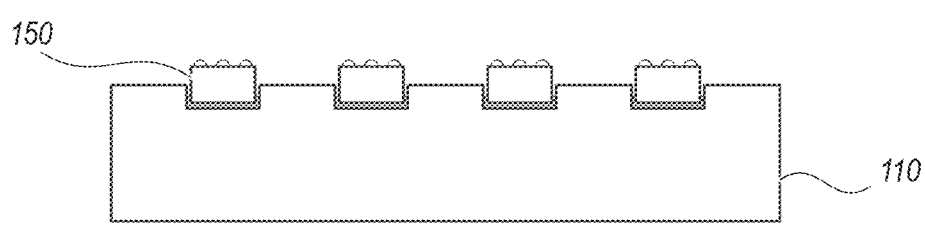

As can be seen with reference to FIG. 1D, an adhesive 140 can be disposed in each of the recesses 130 to facilitate the attachment of semiconductor devices for testing. According to one embodiment, the adhesive can be a laser debondable adhesive, such as 3M™ Light-To-Heat-Conversion Release Coating (LTHC), Tokyo Ohka Kogyo's TZNR-CTRL9 or US244, and the like. After disposing the semiconductor devices 150 to be tested in the corresponding recesses 130, as shown in FIG. 1E, the adhesive 140 can be cured (e.g., by exposure to an ultraviolet light source) to reliably secure the semiconductor devices 150 in position for a test operation. As the sidewalls of the recesses 130 constrain the semiconductor devices 150 from lateral movement, and the adhesive 140 secures the semiconductor devices 150 to the lower surface of the recesses 130, the testing operation can be conducted without displacing the semiconductor devices 150 from the positions in which a subsequent processing apparatus (e.g., configured to remove the semiconductor devices 150 with a picking mechanism) expects them to be.

Figure 2A:
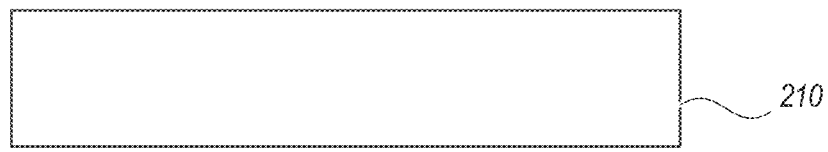
FIGS. 2A-2D are simplified diagrams of a process flow for fabricating a patterned carrier wafer and testing semiconductor devices therewith in accordance with one embodiment of the present technology.
Figure 2B:
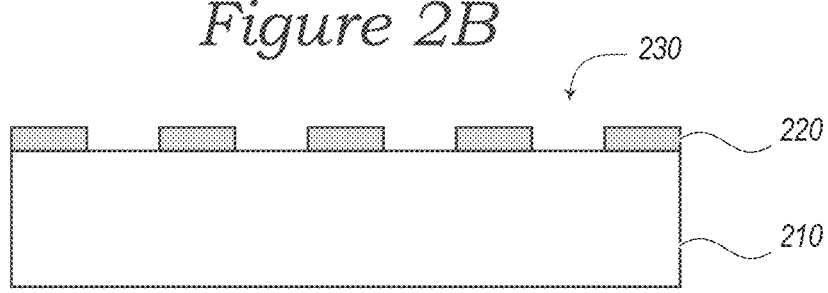

Although in the foregoing example, a patterned carrier wafer is shown in which recesses are formed in a bulk material of the wafer, in other embodiments of the present technology, other approaches to patterning a carrier wafer may be employed. For example, FIGS. 2A-2D are simplified diagrams of a process flow for fabricating a patterned carrier wafer and testing semiconductor devices therewith in accordance with one embodiment of the present technology. As can be seen with reference to FIG. 2A, the process flow begins with a wafer 210, such as a silicon wafer or a glass wafer, of a thickness suitable for supporting semiconductor devices during a probe operation. As shown in FIG. 2B, a layer of patterned photoresist 220 or other mask material can be formed over wafer 210, using conventional photolithography techniques. The patterned photoresist 220 includes a plurality of recesses 230 having a size and shape corresponding to the semiconductor devices that the patterned carrier wafer 210 will be used to test.

Figure 2C:
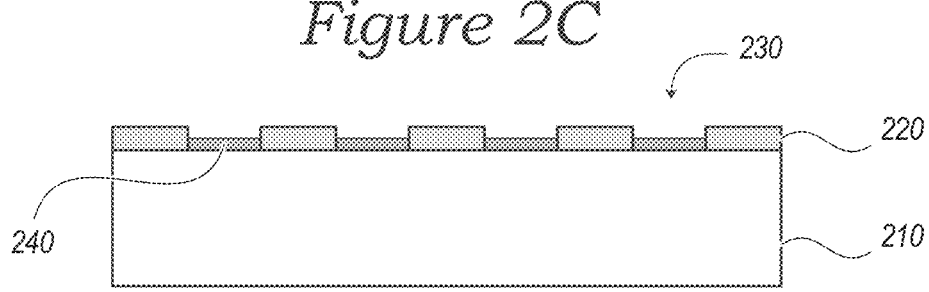
Figure 2D:
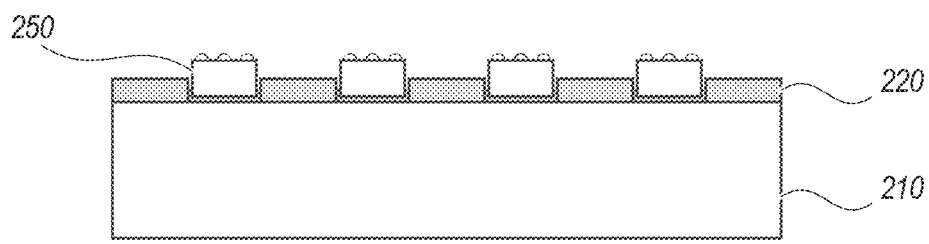

As can be seen with reference to FIG. 2C, an adhesive 240 can be disposed in each of the recesses 230 to facilitate the attachment of semiconductor devices for testing. After disposing the semiconductor devices 250 to be tested in the corresponding recesses 230, as shown in FIG. 2D, the adhesive 240 can be cured (e.g., by exposure to an ultraviolet light source) to reliably secure the semiconductor devices 250 in position for a test operation. As the sidewalls of the recesses 230 constrain the semiconductor devices 250 from lateral movement, and the adhesive 240 secures the semiconductor devices 250 to the lower surface of the recesses 230, the testing operation can be conducted without displacing the semiconductor devices 250 from the positions in which a subsequent processing apparatus (e.g., configured to remove the semiconductor devices 250 with a picking mechanism) expects them to be.

Figure 3:
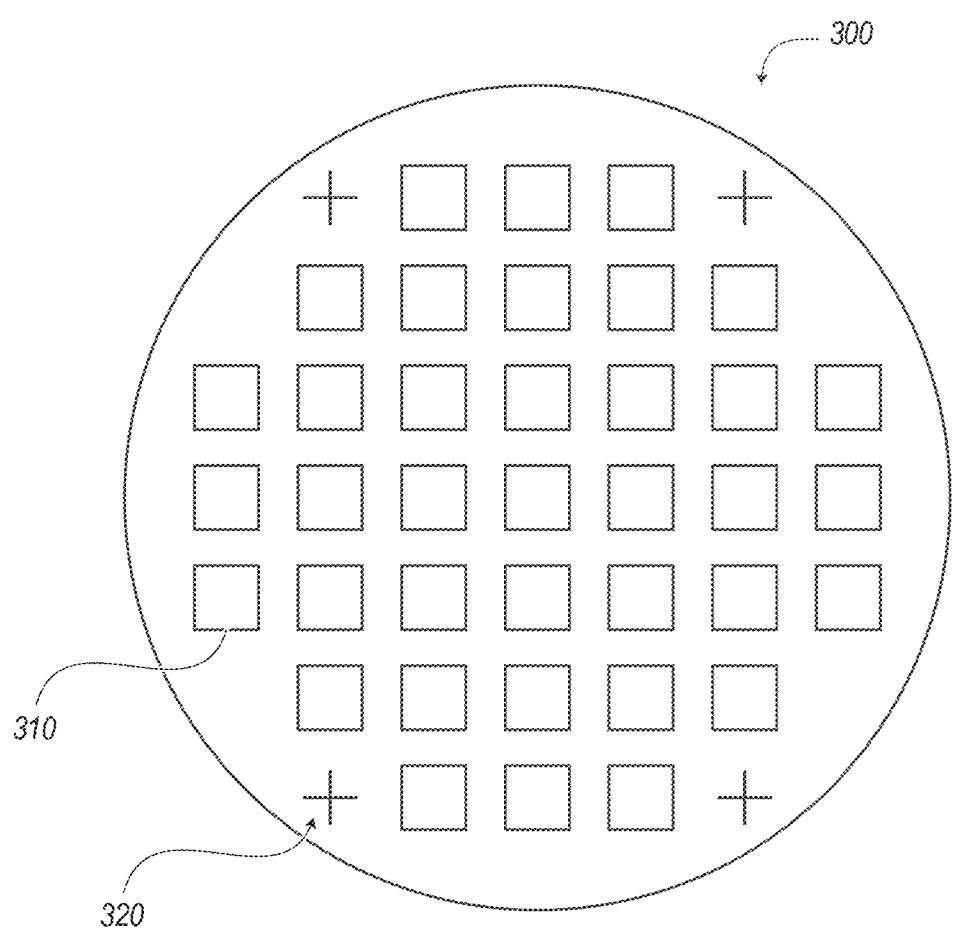
FIG. 3 is a simplified plan view of a patterned carrier wafer in accordance with an embodiment of the present technology.

In accordance with one embodiment of the present technology, to facilitate the placement of semiconductor devices into corresponding recesses in a patterned semiconductor wafer, alignment marks can be patterned onto the wafer (e.g. in the same patterning operation by which the recesses, or the mask used for subsequently forming the recesses, is patterned). By way of example, FIG. 3 is a simplified plan view of a patterned carrier wafer 300 in accordance with an embodiment of the present technology. As can be seen with reference to FIG. 3, patterned carrier wafer 300 includes a plurality of recesses 310, and can include one or more alignment marks, such as alignment marks 320, configured to facilitate the alignment of semiconductor devices with corresponding ones of the plurality of recesses 310 in a placement and/or picking operation.

Figure 4:
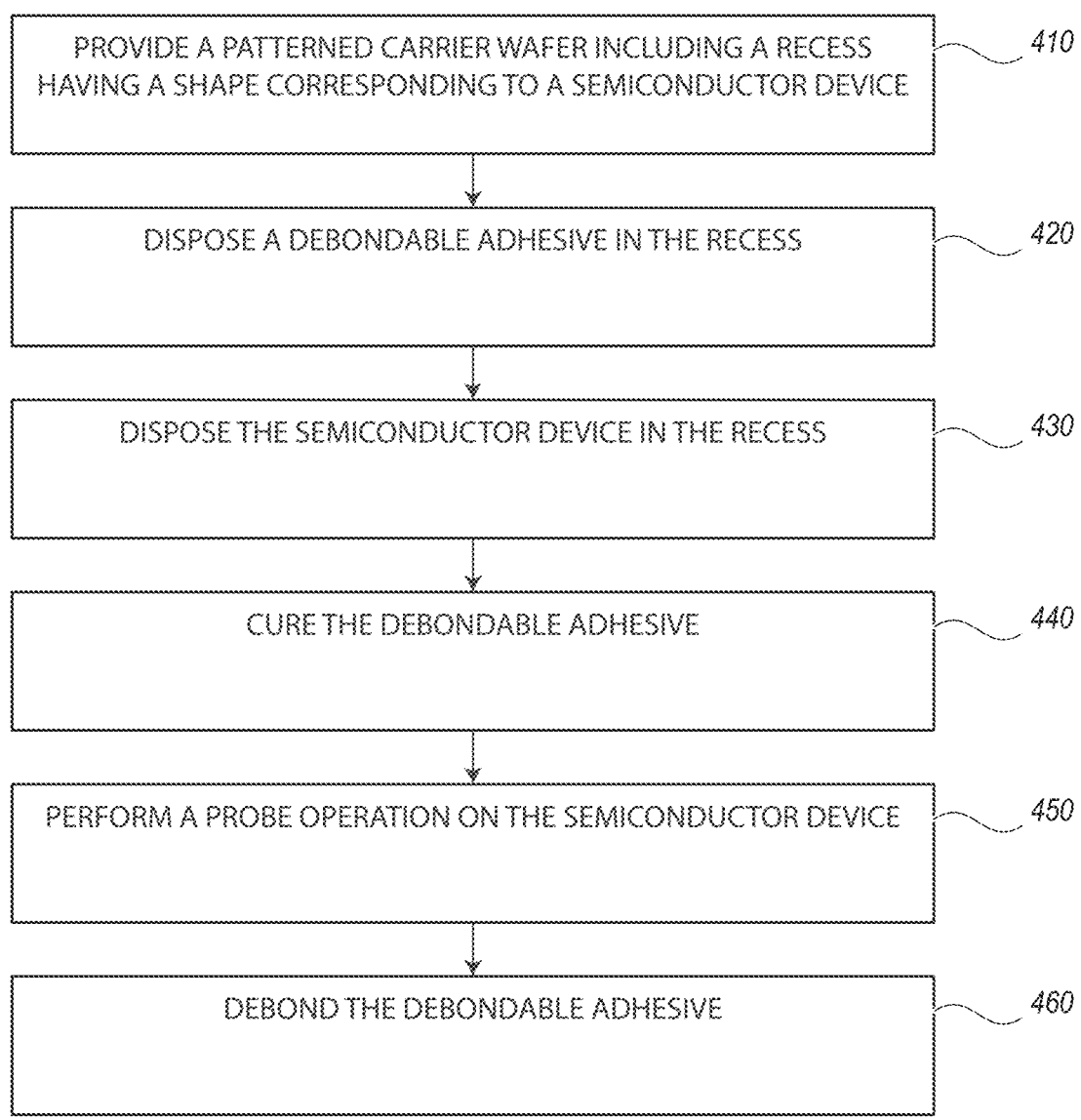
FIG. 4 is a flow chart illustrating a method of testing a semiconductor device in accordance with an embodiment of the present technology.

FIG. 4 is a flow chart illustrating a method of forming a patterned carrier wafer in accordance with an embodiment of the present technology. The method includes providing a patterned carrier wafer including a recess having a shape corresponding to the semiconductor device (box 410). The method can further include disposing a debondable adhesive in the recess (box 420), disposing the semiconductor device in the recess (box 430) and curing the debondable adhesive (box 440). The method can further include performing a probe operation on the semiconductor device (box 450) and debonding the debondable adhesive (box 460).

Figure 5:
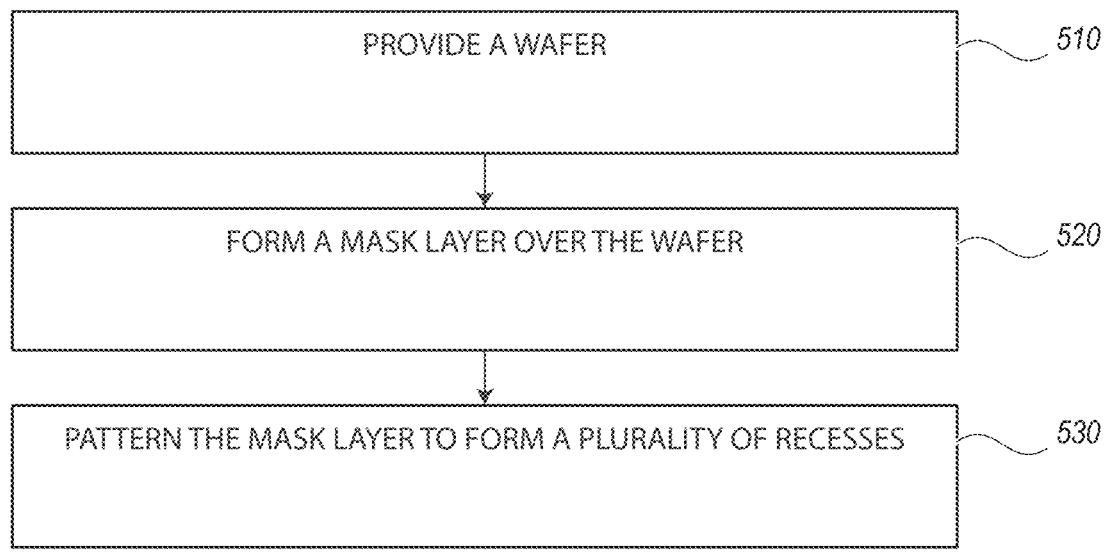
FIG. 5 is a flow chart illustrating a method of forming a patterned carrier wafer in accordance with an embodiment of the present technology.

FIG. 5 is a flow chart illustrating a method of forming a patterned carrier wafer in accordance with an embodiment of the present technology. The method includes providing a wafer (box 510), forming a mask layer over the wafer (box 520), and patterning the mask layer to form a plurality of recesses (box 530), wherein each recess includes a plurality of sidewalls and a lower surface, wherein each recess is configured to receive a semiconductor device, and wherein the plurality of sidewalls of each recess is configured to align the semiconductor device and constrain the semiconductor device from moving in a direction parallel to the second surface.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device testing apparatus, comprising:
a wafer having a first planar surface and a second surface opposite the first surface; wherein the second surface includes a plurality of recesses, each recess including a plurality of sidewalls and a lower surface, each recess configured to receive a semiconductor device, the plurality of sidewalls of each recess configured to align the semiconductor device and constrain the semiconductor device from moving in a direction parallel to the second surface during a probe operation; and
a debondable adhesive disposed on the lower surface of each of the plurality of recesses, the plurality of sidewalls of each of the plurality of recesses being substantially free of the debondable adhesive, the debondable adhesive configured to temporarily adhere back sides of the corresponding semiconductor die to the lower surface during the probe operation.

2. The semiconductor device testing apparatus of claim 1, wherein the debondable adhesive comprises a laser debondable adhesive.

3. The semiconductor device testing apparatus of claim 1, wherein the wafer is a glass wafer.

4. The semiconductor device testing apparatus of claim 1, wherein the wafer is a silicon wafer.

5. The semiconductor device testing apparatus of claim 1, wherein the wafer includes a patterned layer of dielectric material in which the recesses are formed.

6. The semiconductor device testing apparatus of claim 1, wherein the recesses are formed in a bulk material of the wafer.

7. The semiconductor device testing apparatus of claim 1, wherein the wafer includes one or more patterned alignment marks.

8. A method of testing a semiconductor device, comprising:
providing a patterned carrier wafer including a recess having a shape corresponding to the semiconductor device;
disposing a debondable adhesive on a lower surface of the recess, the recess having a plurality of sidewalls remaining substantially free of the debondable adhesive;
adhering a back side of the semiconductor device to the debondable adhesive in the recess;
performing a probe operation on a front side of the semiconductor device.

9. The method of claim 8, further comprising:
curing the debondable adhesive after disposing the semiconductor device in the recess.

10. The method of claim 8, further comprising:
debonding the debondable adhesive after performing the probe operation on the semiconductor device.

11. The method of claim 8, wherein the debondable adhesive comprises a laser debondable adhesive.

12. The method of claim 8, wherein the patterned carrier wafer is a glass wafer.

13. The method of claim 8, wherein the patterned carrier wafer is a silicon wafer.

14. The method of claim 8, wherein the patterned carrier wafer includes a layer of dielectric material in which the recesses are formed.

15. The method of claim 8, wherein the recesses are formed in a bulk material of the patterned carrier wafer.

16. The method of claim 8, wherein the patterned carrier wafer includes one or more alignment marks.

17. The method of claim 16, further comprising:
aligning the semiconductor device with the recess based on the one or more alignment marks before disposing the semiconductor device in the recess.

18. A method of forming a patterned semiconductor carrier wafer, comprising:
providing a wafer;
forming a mask layer over the wafer;
patterning the mask layer to form a plurality of recesses, each having a plurality of sidewalls and a lower surface; and
disposing a debondable adhesive on the lower surface of each of the plurality of recesses, the plurality of sidewalls of each recess remaining substantially free of the debondable adhesive,
wherein each recess is configured to receive a back side of a semiconductor device, and
wherein the plurality of sidewalls of each recess is configured to align the semiconductor device and constrain the semiconductor device from moving in a direction parallel to the second surface during a probe operation performed on a front side of the corresponding semiconductor device.

* * * * *